(12) United States Patent
Aoyama

(10) Patent No.: US 10,886,132 B2
(45) Date of Patent: Jan. 5, 2021

(54) MANUFACTURING METHOD OF HIGH-DIELECTRIC-CONSTANT GATE INSULATING FILM OF SEMICONDUCTOR DEVICE

(71) Applicant: SCREEN HOLDINGS CO., LTD., Kyoto (JP)

(72) Inventor: Takayuki Aoyama, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 16/459,067

(22) Filed: Jul. 1, 2019

(65) Prior Publication Data

US 2019/0326121 A1    Oct. 24, 2019

Related U.S. Application Data

(63) Continuation of application No. 15/642,251, filed on Jul. 5, 2017, now abandoned.

(30) Foreign Application Priority Data

Jul. 6, 2016   (JP) .................. 2016-134021

(51) Int. Cl.
*H01L 21/28*     (2006.01)
*H01L 21/67*     (2006.01)
(Continued)

(52) U.S. Cl.
CPC .. *H01L 21/28176* (2013.01); *H01L 21/28088* (2013.01); *H01L 21/67115* (2013.01);
(Continued)

(58) Field of Classification Search
None
See application file for complete search history.

(56) References Cited

U.S. PATENT DOCUMENTS 9,502,307 B1 *  11/2016  Bao .................. H01L 21/823842
2004/0132293 A1   7/2004  Takayama et al.
(Continued)

FOREIGN PATENT DOCUMENTS

CN   102918636 A    2/2013
JP   05-343336 A   12/1993
(Continued)

OTHER PUBLICATIONS

U.S. PTO Non-Final Office Action issued in corresponding parent U.S. Appl. No. 15/642,251, dated Jan. 10, 2018.
(Continued)

*Primary Examiner* — Zandra V Smith
*Assistant Examiner* — Lawrence C Tynes, Jr.
(74) *Attorney, Agent, or Firm* — McDermott Will & Emery LLP

(57) ABSTRACT

A semiconductor wafer serving as a treatment target has a stack structure in which a high-dielectric-constant gate insulating film is formed on a silicon base material with an interface layer film of silicon dioxide sandwiched therebetween, and a metal gate electrode containing fluorine is further formed thereon. A heat treatment apparatus radiates flash light from a flash lamp to the semiconductor wafer in an atmosphere containing hydrogen to carry out heating treatment for an extremely short period of time of 100 milliseconds or less. As a result, diffusion of nitrogen contained in the metal gate electrode is inhibited, at the same time, only the fluorine is diffused from the high-dielectric-constant gate insulating film to an interface between the interface layer film and the silicon base material to reduce an interface state, and reliability of the gate stack structure can be improved.

4 Claims, 11 Drawing Sheets

(51) Int. Cl.
*H01L 29/51* (2006.01)
*H01L 21/687* (2006.01)
*H01L 21/677* (2006.01)
*H01L 29/78* (2006.01)

(52) U.S. Cl.
CPC ...... *H01L 29/517* (2013.01); *H01L 21/67748* (2013.01); *H01L 21/68721* (2013.01); *H01L 29/513* (2013.01); *H01L 29/78* (2013.01)

(56) References Cited

U.S. PATENT DOCUMENTS

| | | | |
|---|---|---|---|
| 2008/0124850 A1 | 5/2008 | Takayama et al. | |
| 2008/0164539 A1 | 7/2008 | Collaert et al. | |
| 2008/0182430 A1* | 7/2008 | Chen | H01L 29/6659 438/795 |
| 2009/0090975 A1* | 4/2009 | Ong | H01L 21/823807 257/369 |
| 2011/0263115 A1* | 10/2011 | Ganguli | C23C 16/06 438/595 |
| 2012/0080756 A1 | 4/2012 | Suzuki et al. | |
| 2015/0132938 A1* | 5/2015 | Ahmed | H01L 21/28176 438/591 |

FOREIGN PATENT DOCUMENTS

| | | |
|---|---|---|
| JP | 2002-299614 A | 10/2002 |
| JP | 2004-119406 A | 4/2004 |
| JP | 2007-227945 A | 9/2007 |
| JP | 2008-177564 A | 7/2008 |
| JP | 2011-014689 A | 1/2011 |
| JP | 2011-103481 A | 5/2011 |
| JP | 2012-094656 A | 5/2012 |
| JP | 2014-165293 A | 9/2014 |

OTHER PUBLICATIONS

U.S. PTO Final Office Action issued in corresponding parent U.S. Appl. No. 15/642,251, dated Aug. 28, 2018.
U.S. PTO Final Office Action issued in corresponding parent U.S. Appl. No. 15/642,251, dated Jan. 31, 2019.
Parent U.S. Appl. No. 15/642,251, filed Jul. 5, 2017.
Office Action issued in corresponding Taiwanese Patent Application No. 106118482, dated Feb. 2, 2018 (w/partial English translation).
Taiwanese Office Action issued in corresponding Taiwanese Patent Application No. 106118482, dated Aug. 13, 2018, with partial English Translation.
Chinese Office Action issued in corresponding Chinese Patent Application No. 201710540888.1, dated Mar. 9, 2020, with English translation.
Japanese Notice of Reasons for Refusal issued in corresponding Japanese Patent Application No. 2016-134021, dated Mar. 31, 2020, with English translation.
Japanese Decision to Grant a Patent issued in corresponding Japanese Patent Application No. 2016-134201, dated Sep. 29, 2020, with English translation.

* cited by examiner

F I G. 11
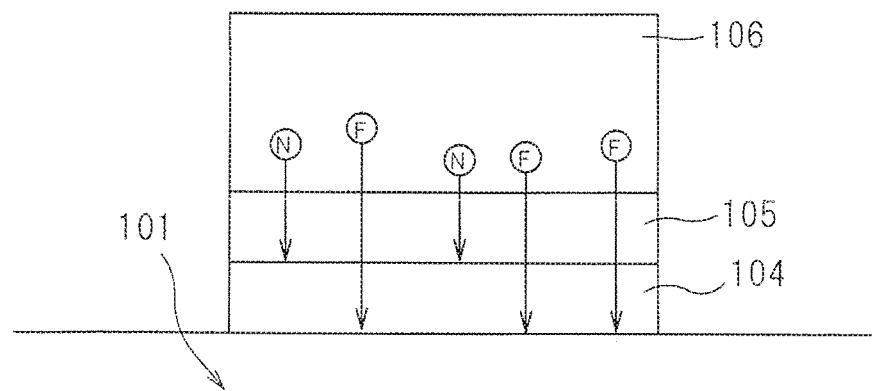

MANUFACTURING METHOD OF HIGH-DIELECTRIC-CONSTANT GATE INSULATING FILM OF SEMICONDUCTOR DEVICE

CROSS REFERENCE OF RELATED APPLICATIONS

This is a Continuation of U.S. patent application Ser. No. 15/642,251 filed on Jul. 5, 2017, which claims the benefit of Japanese Patent Application No. 2016-134021 filed on Jul. 6, 2016, the entire contents of each are hereby incorporated by reference.

BACKGROUND OF THE INVENTION

Field of the Invention

The present invention relates to a manufacturing method of a semiconductor device in which a high-dielectric-constant gate insulating film is formed on a silicon substrate with an interface layer film sandwiched therebetween.

Description of the Background Art

As a gate insulating film of a field-effect transistor (FET), application of a high-dielectric-constant film using a material having a higher dielectric constant (high-dielectric-constant material) than silicon dioxide (SiO2), which has been conventionally general, is studied. The high-dielectric-constant film is being developed as a new stack structure together with a metal gate electrode using metal in a gate electrode in order to solve a problem that a leak current increases along with advancement in thickness reduction of a gate insulating film.

There has been an attempt to introduce fluorine in order to improve the interface characteristics of the field-effect transistor using the high-dielectric-constant gate insulating film. For example, Japanese Patent Application Laid-Open No. 2014-165293 discloses fluorine ion implantation for improving a NBTI (Negative Bias Temperature Instability) phenomenon, which occurs when a negative bias is applied to a gate. Meanwhile, Japanese Patent Application Laid-Open No. 2011-103481 discloses introduction of fluorine by remote plasma treatment.

However, a method of implanting fluorine ions is effective in a case in which a gate insulating film is formed before a source and a drain are formed, but is inconvenient for a process of forming a gate insulating film after a source and a drain are formed (so-called gate last process), which has been a recent mainstream. Moreover, if fluorine is introduced by plasma treatment, damage remains in a gate insulating film due to comparatively-high energy particles.

SUMMARY OF THE INVENTION

The present invention is directed to a manufacturing method of a semiconductor device of forming a high-dielectric-constant gate insulating film on a silicon substrate with an interface layer film sandwiched therebetween.

In one aspect of the present invention, a manufacturing method of a semiconductor device includes following steps of: (a) forming the high-dielectric-constant gate insulating film on a surface of the substrate with the interface layer film of silicon dioxide sandwiched therebetween; (b) forming a film containing fluorine on the high-dielectric-constant gate insulating film; and (c) subjecting the substrate to heating treatment of 100 milliseconds or less to diffuse the fluorine to the high-dielectric-constant gate insulating film and the interface layer film.

The fluorine can be subjected to heat diffusion to the high-dielectric-constant gate insulating film and the interface layer film from the film containing the fluorine, and the fluorine can be introduced without damaging a device structure.

Preferably, in the step (c), the heating treatment of the substrate is carried out in a gas atmosphere of one selected from a group consisting of hydrogen, ammonia, nitrogen trifluoride, and fluorine.

Diffusion control, etc. of the fluorine is enabled.

Therefore, it is an object of the present invention to introduce the fluorine without damaging the device structure.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a diagram for describing a phenomenon which occurs when a surface of the semiconductor wafer is subjected to flash heating.

DESCRIPTION OF THE PREFERRED EMBODIMENTS

Hereinafter, a preferred embodiment of the present invention will be described in detail with reference to drawings.

Figure 1:
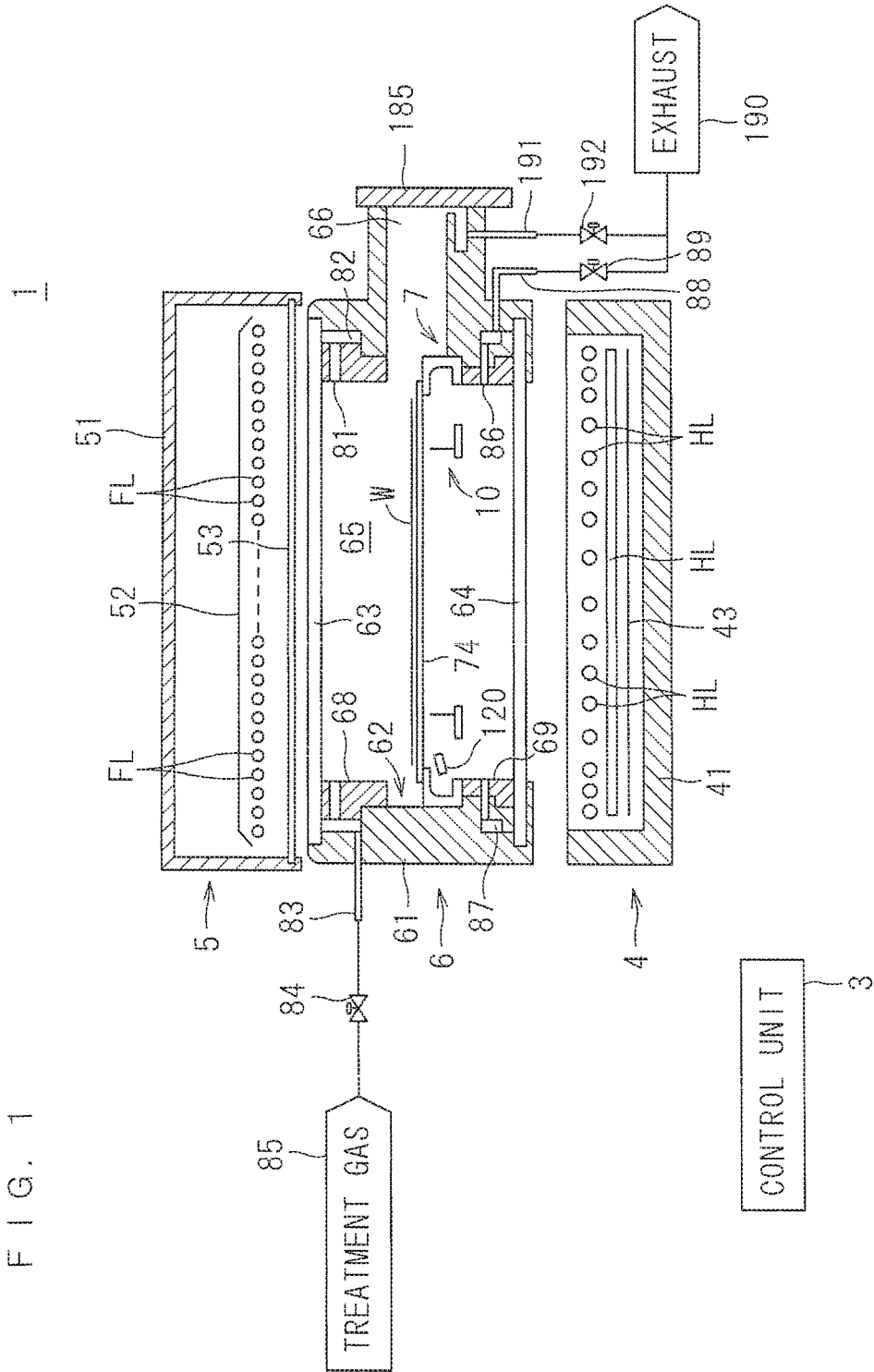
FIG. 1 is a vertical cross-sectional view showing a configuration of a heat treatment apparatus used in a manufacturing method of a semiconductor device according to the present invention.

First, a heat treatment apparatus which executes the heat treatment required to carry out a manufacturing method of a semiconductor device according to the present invention will be described. FIG. 1 is a vertical cross-sectional view showing a configuration of the heat treatment apparatus 1 used in the manufacturing method of the semiconductor device according to the present invention. The heat treatment apparatus 1 of FIG. 1 is a flash-lamp annealing apparatus which carries out flash light radiation with respect to a circular-plate-shaped semiconductor wafer W serving as a substrate, thereby heating the semiconductor wafer W. The size of the semiconductor wafer W serving as a processing target is not particularly limited, but, for example, has a diameter of 300 mm or a diameter of 450 mm. Note that, in FIG. 1 and the views thereafter, the dimensions or numbers of parts are illustrated to be exaggerated or simplified in accordance with needs in order to facilitate understanding.

The heat treatment apparatus 1 is provided with a chamber 6, which houses the semiconductor wafer W; a flash heating unit 5, which incorporates a plurality of flash lamps FL; and a halogen heating unit 4, which incorporates a plurality of halogen lamps HL. The flash heating unit 5 is provided in the upper side of the chamber 6, and the halogen heating unit 4 is provided in the lower side. Moreover, the heat treatment apparatus 1 is provided with, in the chamber 6, a retention unit 7, which retains the semiconductor wafer W in a horizontal orientation, and a transfer mechanism 10, which delivers the semiconductor wafer W between the retention unit 7 and outside of the apparatus. Furthermore, the heat treatment apparatus 1 is provided with a control unit 3, which controls the operation mechanisms provided in the halogen heating unit 4, the flash heating unit 5, and the chamber 6 and causes them to execute heat treatment of the semiconductor wafer W.

The chamber 6 is formed by attaching quartz-made chamber windows to the top and the bottom of a tubular chamber lateral part 61. The chamber lateral part 61 has an approximately tubular shape with the open top and bottom, an upper chamber window 63 is attached to close the upper opening, and a lower chamber window 64 is attached to close the lower opening. The upper chamber window 63 constituting a ceiling part of the chamber 6 is a circular-plate-shaped member formed of quartz and functions as a quartz window which allows the flash light emitted from the flash heating unit 5 to transmit therethrough into the chamber 6. The lower chamber window 64 constituting a floor part of the chamber 6 is also a circular-plate-shaped member formed of quartz and functions as a quartz window which allows the light from the halogen heating unit 4 to transmit therethrough into the chamber 6.

Meanwhile, a reflection ring 68 is attached to an upper part of the inner wall surface of the chamber lateral part 61, and a reflection ring 69 is attached to a lower part thereof. Both of the reflection rings 68 and 69 are formed into annular shapes. The upper reflection ring 68 is attached by fitting from the upper side of the chamber lateral part 61. On the other hand, the lower reflection ring 69 is attached by fitting from the lower side of the chamber lateral part 61 and fixing with a screw(s) (not shown). Therefore, both of the reflection rings 68 and 69 are detachably attached to the chamber lateral part 61. The inside space of the chamber 6, in other words, the space surrounded by the upper chamber window 63, the lower chamber window 64, the chamber lateral part 61, and the reflection rings 68 and 69 is defined as heat treatment space 65.

When the reflection rings 68 and 69 are attached to the chamber lateral part 61, a recessed part 62 is formed on the inner wall surface of the chamber 6. More specifically, the recessed part 62 surrounded by the central part to which the reflection rings 68 and 69 are not attached on the inner wall surface of the chamber lateral part 61, a lower end surface of the reflection ring 68, and an upper end surface of the reflection ring 69 is formed. The recessed part 62 is annularly formed on the inner wall surface of the chamber 6 along the horizontal direction and surrounds the retention unit 7, which retains the semiconductor wafer W.

The chamber lateral part 61 and the reflection rings 68 and 69 are formed of metal materials (for example, stainless steel) which are excellent in strength and heat resistance. The inner peripheral surfaces of the reflection rings 68 and 69 are formed into mirror surfaces by electrolytic nickel plating.

A conveyance opening (furnace opening) 66 for carrying-in and carrying-out the semiconductor wafer W to/from the chamber 6 is formed in the chamber lateral part 61. The conveyance opening 66 can be opened/closed by a gate valve 185. The conveyance opening 66 is communicated with and connected to the outer peripheral surface of the recessed part 62. Therefore, while the gate valve 185 opens the conveyance opening 66, the semiconductor wafer W can be carried into the heat treatment space 65 from the conveyance opening 66 through the recessed part 62, and the semiconductor wafer W can be carried out from the heat treatment space 65. When the gate valve 185 closes the conveyance opening 66, the heat treatment space 65 in the chamber 6 becomes hermetically sealed space.

A gas supply hole(s) 81, which supplies a treatment gas to the heat treatment space 65, is formed in an upper part of the inner wall of the chamber 6. The gas supply hole 81 is formed at a position above the recessed part 62 and may be provided in the reflection ring 68. The gas supply hole 81 is communicated with and connected to a gas supplying pipe 83 via buffer space 82, which is annularly formed in a lateral wall of the chamber 6. The gas supplying pipe 83 is connected to a treatment-gas supply source 85. A valve 84 is inserted to an intermediate part of a path of the gas supplying pipe 83. When the valve 84 is opened, the treatment gas is fed from the treatment-gas supply source 85 to the buffer space 82. The treatment gas flowed into the buffer space 82 flows so as to spread in the buffer space 82, which has a smaller fluid resistance than that of the gas supply hole 81, and is supplied into the heat treatment space 65 from the gas supply hole 81. As the treatment gas, hydrogen ($H_2$), ammonia ($NH_3$), nitrogen trifluoride ($NF_3$), fluorine ($F_2$), or the like mixed with nitrogen ($N_2$) or inert gas (He, Ar, etc.) serving as a carrier gas is used.

On the other hand, a gas exhaust hole(s) 86, which discharges the gaseous matter in the heat treatment space 65, is formed in a lower part of the inner wall of the chamber 6. The gas exhaust hole 86 is formed at a position below the recessed part 62 and may be provided in the reflection ring 69. The gas exhaust hole 86 is communicated with and connected to a gas exhaust pipe 88 via buffer space 87, which is annularly formed in the lateral wall of the chamber 6. The gas exhaust pipe 88 is connected to an exhaust unit 190. A valve 89 is inserted to an intermediate part of a path of the gas exhaust pipe 88. When the valve 89 is opened, the gaseous matter in the heat treatment space 65 is discharged to the gas exhaust pipe 88 from the gas exhaust hole 86 through the buffer space 87. The plurality of gas supply holes 81 and the gas exhaust holes 86 may be provided along the circumferential direction of the chamber 6 or may have slit shapes. The treatment-gas supply source 85 and the exhaust unit 190 may be the mechanisms provided in the heat treatment apparatus 1 or may be utilities of a plant in which the heat treatment apparatus 1 is installed.

A gas exhaust pipe 191, which discharges the gaseous matter in the heat treatment space 65, is connected also to a distal end of the conveyance opening 66. The gas exhaust pipe 191 is connected to the exhaust unit 190 via a valve 192. When the valve 192 is opened, the gaseous matter in the chamber 6 is discharged via the conveyance opening 66.

Figure 2:
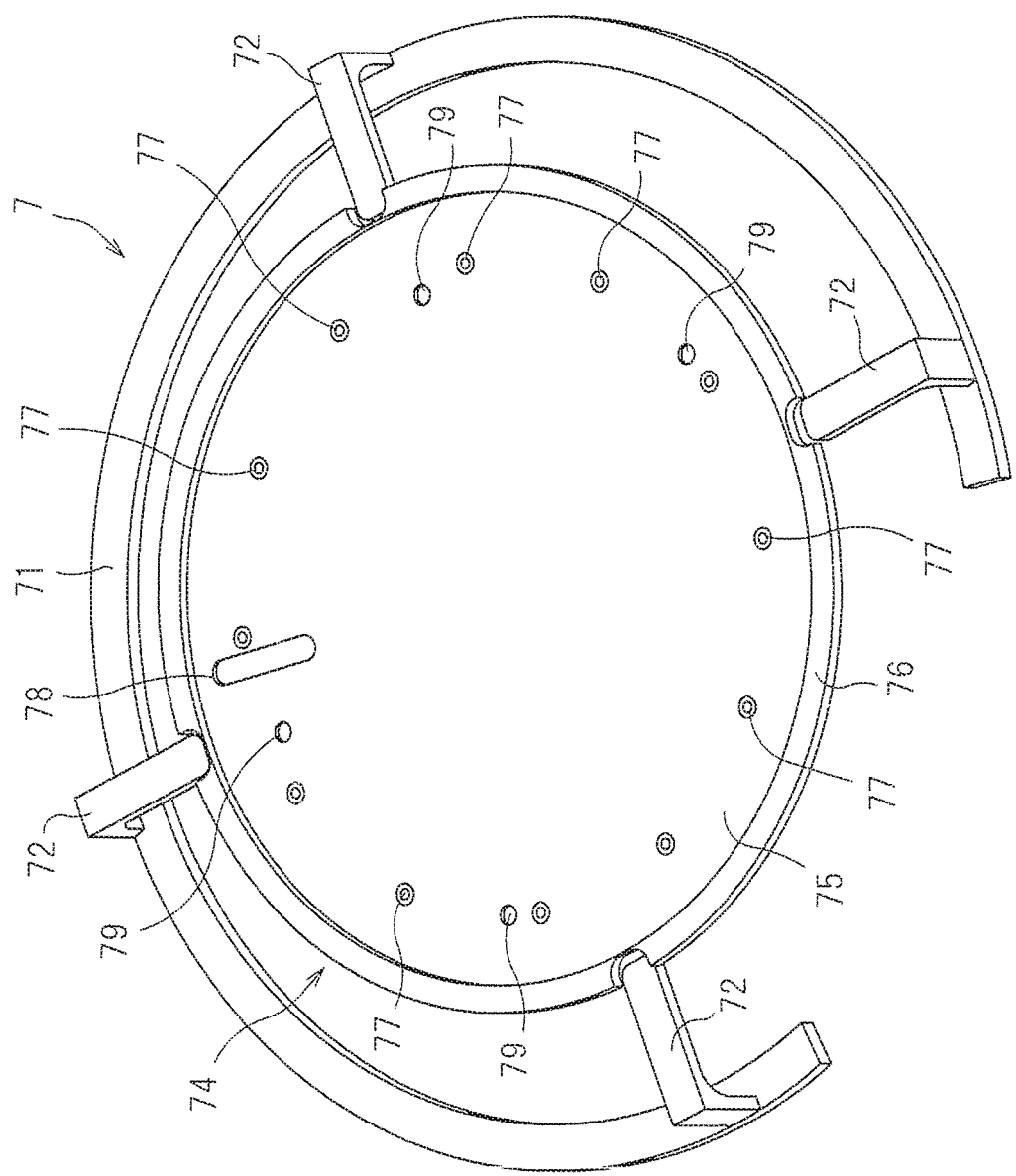
FIG. 2 is a perspective view showing an overall appearance of a retention unit.

FIG. 2 is a perspective view showing an overall appearance of the retention unit 7. The retention unit 7 includes a base ring 71, coupling parts 72, and a susceptor 74. All of the base ring 71, the coupling parts 72, and the susceptor 74 are formed of quartz. In other words, the entire retention unit 7 is formed of quartz.

The base ring 71 is a quartz member having an arc shape, which is a partially-missing annular shape. This missing part is provided in order to prevent interference between later-described transfer arms 11 of the transfer mechanism 10 and the base ring 71. The base ring 71 is placed on the bottom surface of the recessed part 62 and is, as a result, supported by the wall surface of the chamber 6 (see FIG. 1). The plurality of (four in the present preferred embodiment) coupling parts 72 are provided to rise from the upper surface of the base ring 71 along the circumferential direction of the annular shape thereof. The coupling parts 72 are also quartz members and are fixed to the base ring 71 by welding.

Figure 3:
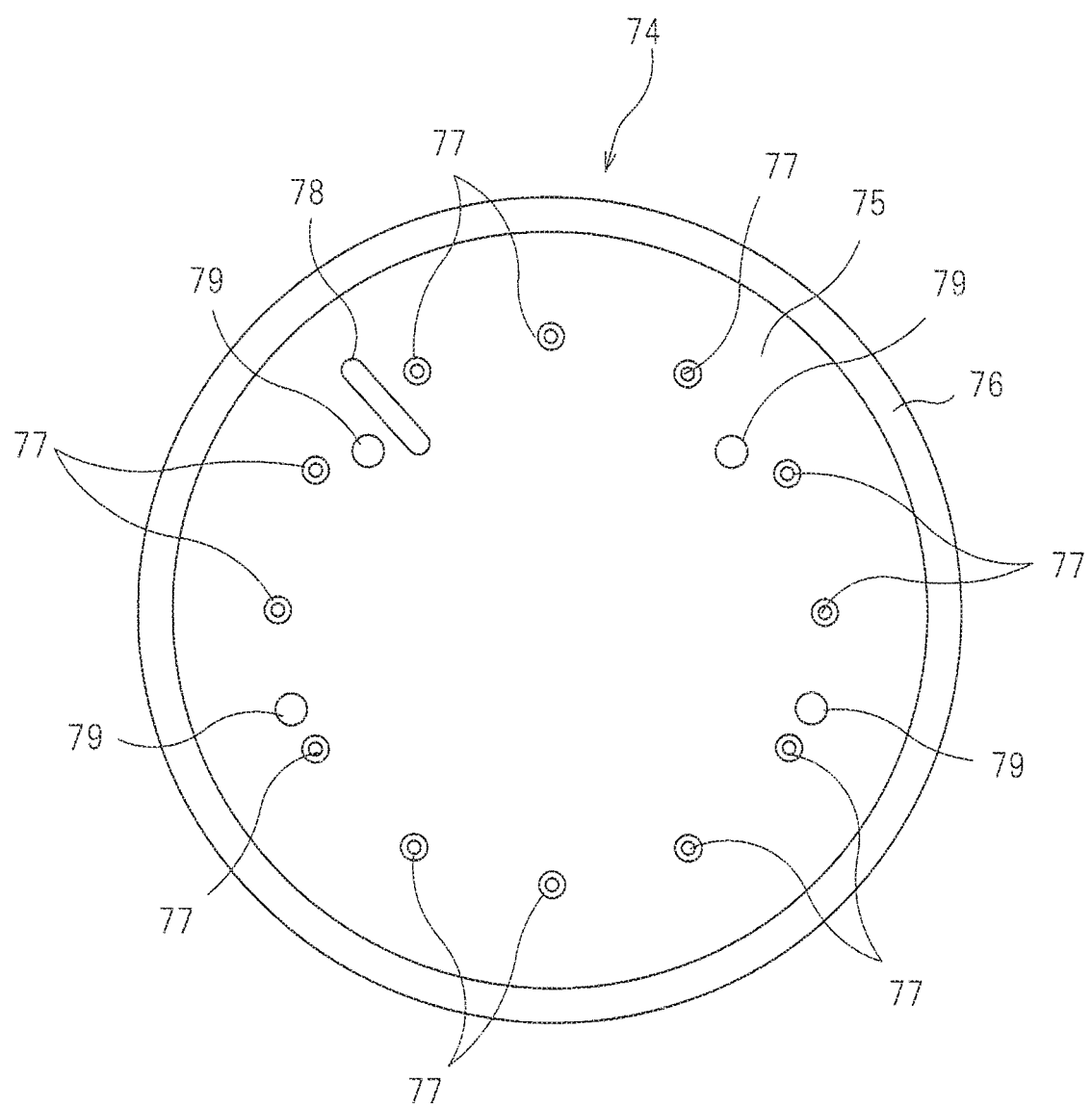
FIG. 3 is a plan view of a susceptor.
Figure 4:
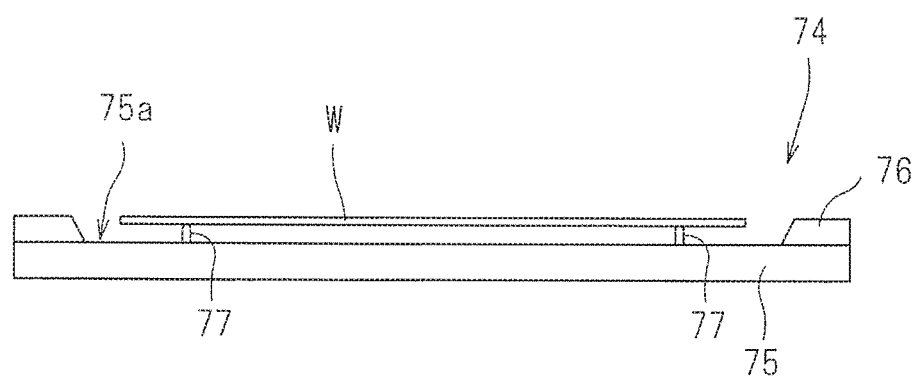
FIG. 4 is a cross-sectional view of the susceptor.

The susceptor 74 is supported by the four coupling parts 72 provided on the base ring 71. FIG. 3 is a plan view of the susceptor 74. FIG. 4 is a cross-sectional view of the susceptor 74. The susceptor 74 is provided with a retention plate 75, a guide ring 76, and a plurality of substrate support pins 77. The retention plate 75 is an approximately-circular flat-plate-shaped member formed of quartz. The diameter of the retention plate 75 is larger than the diameter of the semiconductor wafer W. In other words, the retention plate 75 has a larger planar size than the semiconductor wafer W.

The guide ring 76 is installed at an upper-surface peripheral part of the retention plate 75. The guide ring 76 is an annular member having a larger inner diameter than the diameter of the semiconductor wafer W. For example, if the diameter of the semiconductor wafer W is 300 mm, the inner diameter of the guide ring 76 is 320 mm. The inner periphery of the guide ring 76 is formed into a tapered surface which is widened upward from the retention plate 75. The guide ring 76 is formed of quartz, which is similar to that of the retention plate 75. The guide ring 76 may be welded onto the upper surface of the retention plate 75 or may be fixed to the retention plate 75 with separately processed pins or the like. Alternatively, the retention plate 75 and the guide ring 76 may be processed as an integrated member.

The region of the upper surface of the retention plate 75 that is in the inside of the guide ring 76 serves as a planar retention surface 75a, which retains the semiconductor wafer W. The plurality of substrate support pins 77 are provided to rise from the retention surface 75a of the retention plate 75. In the present preferred embodiment, in total, twelve substrate support pins 77 are provided to rise therefrom at every 30° along the circumference of a concentric circle of the outer circumferential circle of the retention surface 75a (inner circumferential circle of the guide ring 76). The diameter of the circle on which the twelve substrate support pins 77 are disposed (the distance between the opposed substrate support pins 77) is smaller than the diameter of the semiconductor wafer W and, if the diameter of the semiconductor wafer W is 300 mm, is 270 mm to 280 mm (280 mm in the present preferred embodiment). Each of the substrate support pins 77 is formed of quartz. The plurality of substrate support pins 77 may be provided on the upper surface of the retention plate 75 by welding or may be integrally processed with the retention plate 75.

Returning to FIG. 2, the four coupling parts 72, which are provided to rise from the base ring 71, and peripheral parts of the retention plate 75 of the susceptor 74 are fixed by welding. In other words, the susceptor 74 and the base ring 71 are fixedly coupled by the coupling parts 72. When the base ring 71 of the retention unit 7 is supported by the wall surface of the chamber 6, the retention unit 7 is attached to the chamber 6. In the state in which the retention unit 7 is attached to the chamber 6, the retention plate 75 of the susceptor 74 is in a horizontal orientation (an orientation in which the normal line thereof matches the vertical direction). Therefore, the retention surface 75a of the retention plate 75 becomes a horizontal surface.

The semiconductor wafer W carried into the chamber 6 is placed and retained in the horizontal orientation on the susceptor 74 of the retention unit 7 attached to the chamber 6. At this point, the semiconductor wafer W is retained by the susceptor 74 by being supported by the twelve substrate support pins 77, which are provided to rise from the retention plate 75. More strictly, upper ends of the twelve substrate support pins 77 contact the lower surface of the semiconductor wafer W and support the semiconductor wafer W. Since the heights of the twelve substrate support pins 77 (the distances from the upper ends of the substrate support pins 77 to the retention surface 75a of the retention plate 75) are equal, the semiconductor wafer W can be supported in the horizontal orientation by the twelve substrate support pins 77.

The semiconductor wafer W is supported by the plurality of substrate support pins 77 with a predetermined interval from the retention surface 75a of the retention plate 75. The thickness of the guide ring 76 is larger than the height of the substrate support pins 77. Therefore, horizontal-direction misalignment of the semiconductor wafer W, which is supported by the plurality of substrate support pins 77, is prevented by the guide ring 76.

As shown in FIG. 2 and FIG. 3, a vertically-penetrating opening 78 is formed in the retention plate 75 of the susceptor 74. The opening 78 is provided so that a radiation thermometer 120 (see FIG. 1) receives the radiated light (infrared light) radiated from the lower surface of the semiconductor wafer W retained by the susceptor 74. More specifically, the radiation thermometer 120 receives the light, which is radiated from the lower surface of the semiconductor wafer W retained by the susceptor 74, via the opening 78, and the temperature of the semiconductor wafer W is measured by a separately-placed detector. Furthermore, in the retention plate 75 of the susceptor 74, four through holes 79, which are penetrating therethrough for delivering the semiconductor wafer W by later-described lift pins 12 of the transfer mechanism 10, are bored.

Figure 5:
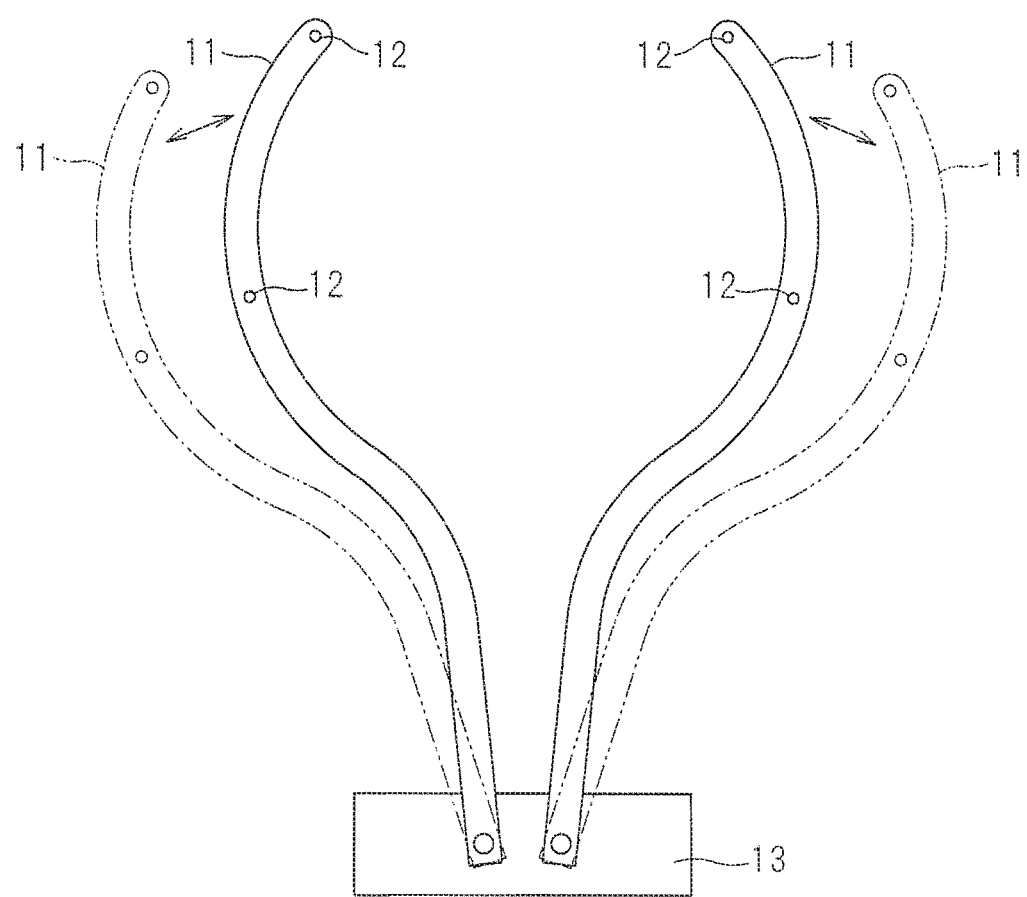
FIG. 5 is a plan view of a transfer mechanism.
Figure 6:
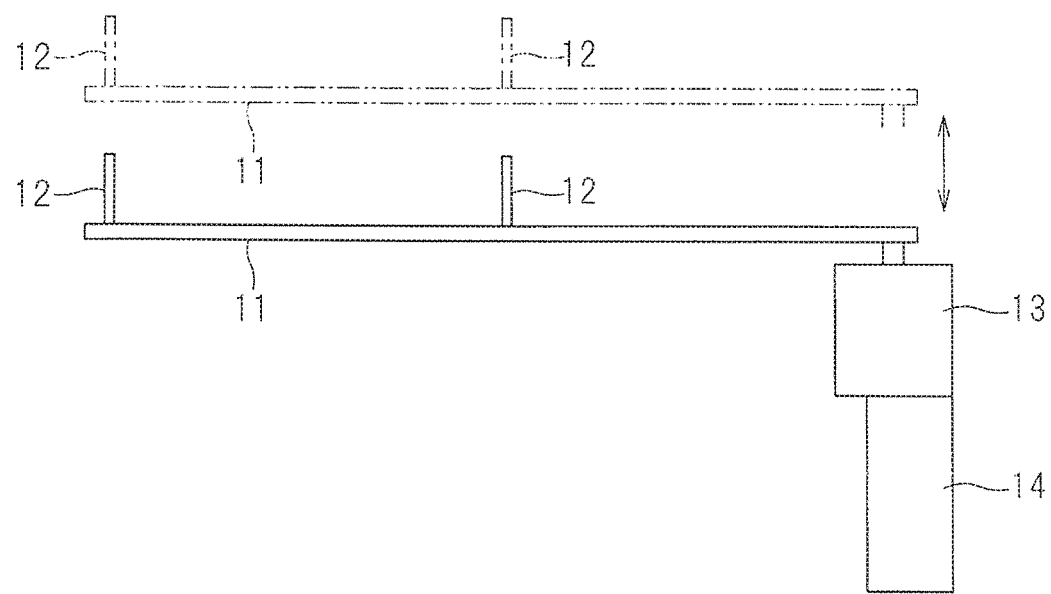
FIG. 6 is a lateral view of the transfer mechanism.

FIG. 5 is a plan view of the transfer mechanism 10. FIG. 6 is a lateral view of the transfer mechanism 10. The transfer mechanism 10 is provided with the two transfer arms 11. The transfer arm 11 is formed into an arc shape, which is along the approximately-annular recessed part 62. The two lift pins 12 are provided to rise from each of the transfer arms 11. Each of the transfer arms 11 is pivotable by a horizontal movement mechanism 13. The horizontal movement mechanism 13 subjects the pair of transfer arms 11 to horizontal movement between transfer operation positions (the positions of solid lines in FIG. 5) at which the semiconductor wafer W is transferred with respect to the retention unit 7 and escape positions (the positions of two-dot chain lines in FIG. 5) which are not overlapped with the semiconductor wafer W, which is retained by the retention unit 7, in a planar view. The horizontal movement mechanism 13 may be one that turns the transfer arms 11 respectively by individual motors or may be one that turns the pair of transfer arms 11 in coordination by a single motor by using a link mechanism.

The pair of transfer arms 11 are subjected to upward/downward movement by an elevating mechanism 14 together with the horizontal movement mechanism 13. When the elevating mechanism 14 moves up the pair of transfer arms 11 at the transfer operation positions, the four lift pins 12 in total pass through the through holes 79 (see FIGS. 2 and 3) bored in the susceptor 74, and the upper ends of the lift pins 12 project from the upper surface of the susceptor 74. On the other hand, the elevating mechanism 14 moves down the pair of transfer arms 11 at the transfer operation positions to remove the lift pins 12 from the through holes 79, and the horizontal movement mechanism 13 moves so as to open the pair of transfer arms 11; as a result, the transfer arms 11 are moved to the escape positions. The escape positions of the pair of transfer arms 11 are immediately above the base ring 71 of the retention unit 7. Since the base ring 71 is placed on the bottom surface of the recessed part 62, the escape positions of the transfer arms 11 are in the inside of the recessed part 62. Also in the vicinity of the part at which a drive unit (the horizontal movement mechanism 13 and the up/down mechanism 14) of the transfer mechanism 10 is provided, an exhaust mechanism (not shown) is provided and is configured to discharge the atmosphere around the drive unit of the transfer mechanism 10 to outside of the chamber 6.

Returning to FIG. 1, the flash heating unit 5 provided above the chamber 6 includes, in a housing 51, light sources, which include a plurality of (30 in the present preferred embodiment) xenon flash lamps FL, and a reflector 52, which is provided so as to cover the upper side of the light sources. A lamp-light radiation window 53 is attached to a bottom part of the housing 51 of the flash heating unit 5. The lamp-light radiation window 53 constituting a floor part of the flash heating unit 5 is a plate-shaped quartz window formed of quartz. As a result of installing the flash heating unit 5 above the chamber 6, the lamp-light radiation window 53 is opposed to the upper chamber window 63. The flash lamps FL radiate flash light to the heat treatment space 65 from the upper side of the chamber 6 via the lamp-light radiation window 53 and the upper chamber window 63.

The plurality of flash lamps FL are respectively rod-shaped lamps having long cylindrical shapes and are planarly arranged so that the longitudinal directions thereof are parallel to each other along a main surface of the semiconductor wafer W retained by the retention unit 7 (in other words, along the horizontal direction). Therefore, the plane formed by the arrangement of the flash lamps FL is also a horizontal plane.

Figure 8:
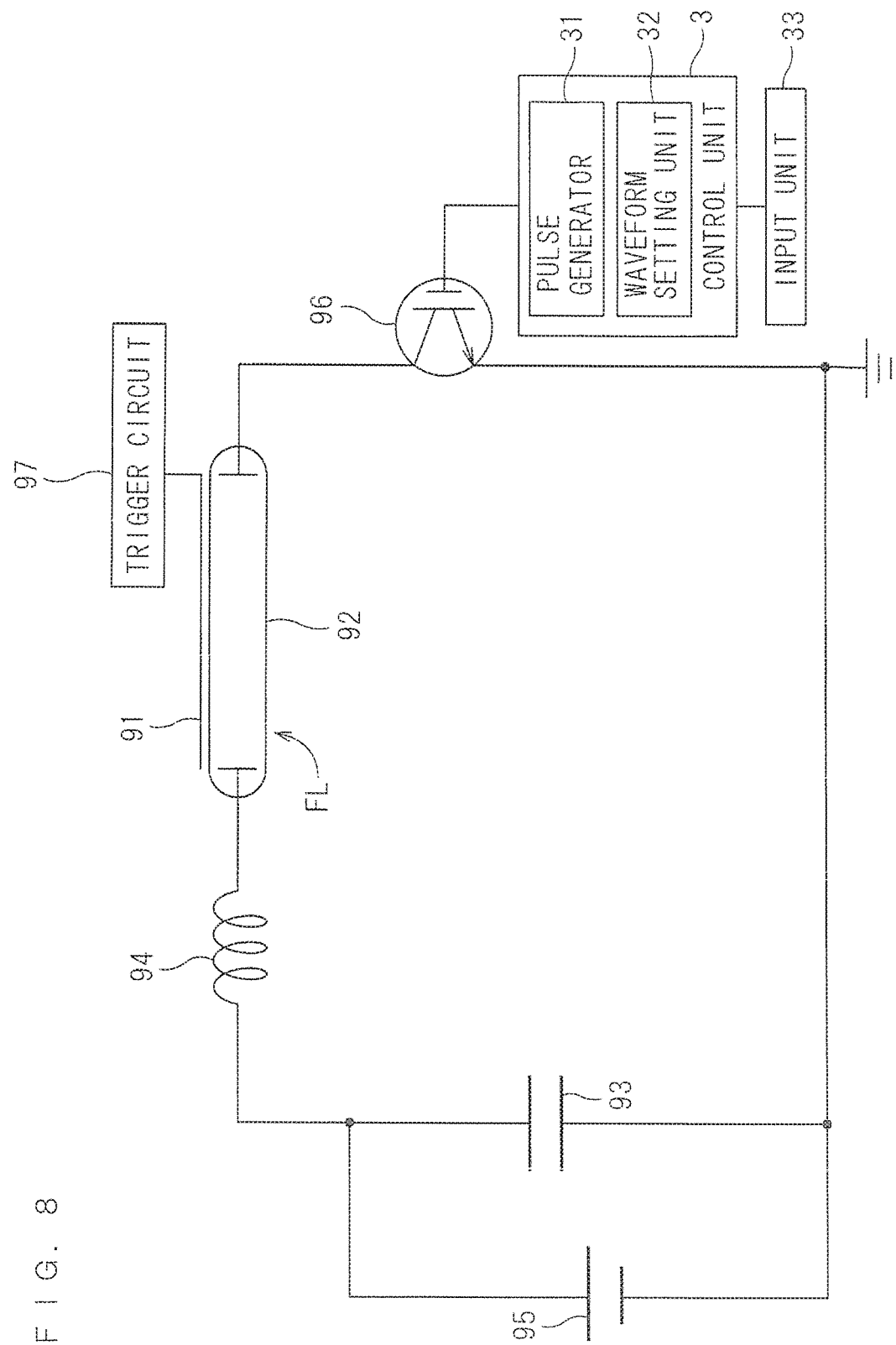
FIG. 8 is a diagram showing a drive circuit of a flash lamp.

FIG. 8 is a diagram showing a drive circuit of the flash lamp FL. As shown in this diagram, a capacitor 93, a coil 94, the flash lamp FL, and an IGBT (insulated gate bipolar transistor) 96 are connected in series. As shown in FIG. 8, the control unit 3 is provided with a pulse generator 31 and a waveform setting unit 32 and is connected to an input unit 33. As the input unit 33, various publicly-known input devices such as a keyboard, a mouse, and a touch panel can be employed. Based on the input contents from the input unit 33, the waveform setting unit 32 sets the waveform of a pulse signal, and the pulse generator 31 generates the pulse signal in accordance with the waveform.

The flash lamp FL is provided with a rod-shaped glass tube (discharge tube) 92, which has a xenon gas sealed therein and disposes a positive electrode and a negative electrode at both ends thereof, and a trigger electrode 91, which is attached on the outer peripheral surface of the glass tube 92. A predetermined voltage is applied to the capacitor 93 by an electric-power-source unit 95, and the capacitor 93 is charged with the electric charge corresponding to the applied voltage (charge voltage) thereof. A high voltage can be applied to the trigger electrode 91 from a trigger circuit 97. The timing of applying the voltage to the trigger electrode 91 by the trigger circuit 97 is controlled by the control unit 3.

The IGBT 96 is a bipolar transistor incorporating a MOSFET (Metal Oxide Semiconductor Field effect transistor) into a gate part and is a switching element suitable for handling large electric power. The pulse signal is applied to the gate of the IGBT 96 from the pulse generator 31 of the control unit 3. If a voltage equal to or more than a predetermined value (High voltage) is applied to the gate of the IGBT 96, the IGBT 96 becomes an on-state; and, if a voltage less than the predetermined value (Low voltage) is applied thereto, the IGBT 96 becomes an off-state. In this manner, the drive circuit including the flash lamp FL is turned on/off by the IGBT 96. When the IGBT 96 is turned on/off, the connection to the capacitor 93 corresponding to the flash lamp FL is connected/disconnected, and the current flowing to the flash lamp FL is subjected to on/off control.

Even if the IGBT 96 becomes the on-state in a state in which the capacitor 93 is charged and applies a high voltage to the both-end electrodes of the glass tube 92, since the xenon gas is an electrical insulator, electricity does not flow in the glass tube 92 in a normal state. However, if the trigger circuit 97 applies the high voltage to the trigger electrode 91 and breaks down insulation, discharge between the both-end electrodes causes a current to instantly flow in the glass tube 92, and light is emitted by the excitation of atoms or molecules of xenon of this process.

The drive circuit as shown in FIG. 8 is individually provided for each of the plurality of flash lamps FL provided in the flash heating unit 5. In the present preferred embodiment, since the 30 flash lamps FL are planarly arranged, corresponding to them, 30 drive circuits like that shown in FIG. 8 are provided. Therefore, the currents flowing to the 30 flash lamps FL, respectively, are subjected to individual on/off control by the corresponding IGBTs 96.

Meanwhile, the reflector 52 is provided above the plurality of flash lamps FL so as to cover the entirety thereof. A basic function of the reflector 52 is to reflect the flash light, which is emitted from the plurality of flash lamps FL, to the side of the heat treatment space 65. The reflector 52 is formed of an aluminum alloy plate, and the surface thereof (the surface on the side facing the flash lamps FL) has undergone surface roughening processing by blast treatment.

The halogen heating unit 4 provided below the chamber 6 incorporates the plurality of (40 in the present preferred embodiment) halogen lamps HL in a housing 41. The halogen heating unit 4 is a light radiation unit which carries out light radiation to the heat treatment space 65 from the lower side of the chamber 6 via the lower chamber window 64 by the plurality of halogen lamps HL and heats the semiconductor wafer W.

Figure 7:
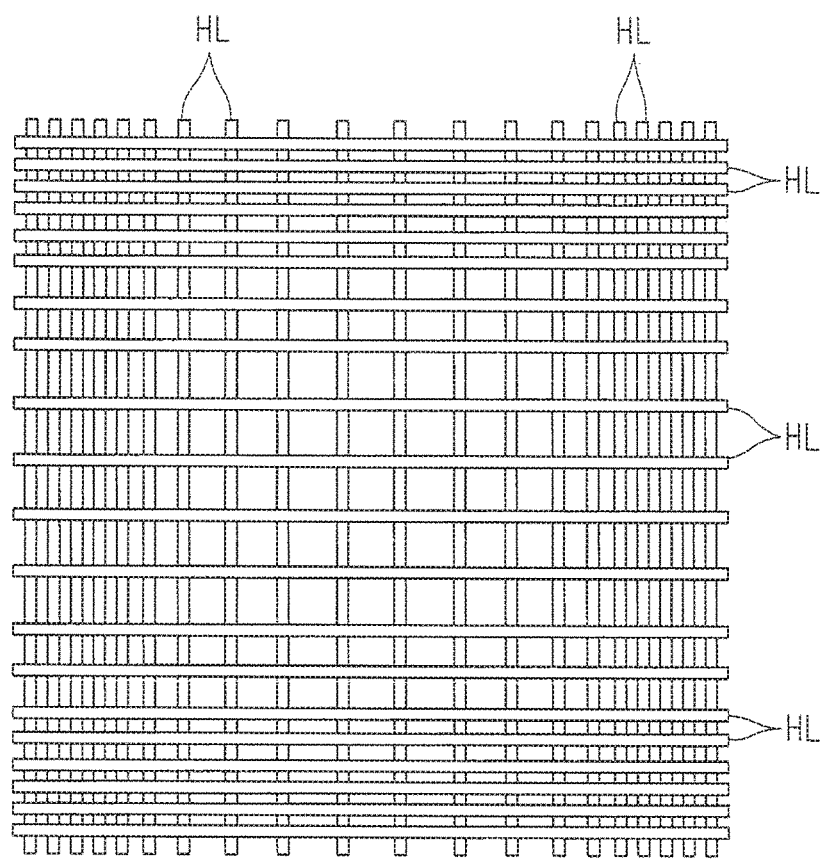
FIG. 7 is a plan view showing a disposition of a plurality of halogen lamps.

FIG. 7 is a plan view showing a disposition of the plurality of halogen lamps HL. The 40 halogen lamps HL are disposed separately in upper/lower two levels. The 20 halogen lamps HL are disposed in the upper level which is close to the retention unit 7, and the 20 halogen lamps HL are disposed also in the lower level which is more distant from the retention unit 7 than the upper level. Each of the halogen lamps HL is a rod-shaped lamp having a long cylindrical shape. Both in the upper level and the lower level, the 20 halogen lamps HL are arranged so that the longitudinal directions thereof are parallel to one another along the main surface of the semiconductor wafer W retained by the retention unit 7 (in other words, along the horizontal direction). Therefore, both in the upper level and the lower level, the plane formed by the arrangement of the halogen lamps HL is a horizontal plane.

As shown in FIG. 7, compared with the region opposed to a central part of the semiconductor wafer W retained by the retention unit 7, the disposition density of the halogen lamps HL is higher in the region opposed to a peripheral part thereof both in the upper level and the lower level. In other words, both in the upper and lower levels, the disposition pitches of the halogen lamps HL are shorter in the peripheral part than in the central part of the lamp arrangement. Therefore, radiation with a higher light intensity can be carried out for the peripheral part of the semiconductor wafer W in which temperature reduction easily occurs in a case of heating by the light radiation from the halogen heating unit 4.

The lamp group including the halogen lamps HL of the upper level and the lamp group including the halogen lamps HL of the lower level are arranged so as to intersect with each other like a lattice. In other words, the 40 halogen lamps HL in total are disposed so that the longitudinal direction of the 20 halogen lamps HL disposed in the upper level and the longitudinal direction of the 20 halogen lamps HL disposed in the lower level intersect with each other.

The halogen lamps HL are the light sources of a filament type in which light is emitted by causing a filament to be incandescent by distributing electricity to the filament disposed in the glass tube. In the glass tube, a gaseous matter of an inert gas such as nitrogen or argon to which a minute amount of halogen element (iodine, bromine, etc.) is introduced is sealed. As a result of introducing the halogen element, the temperature of the filament can be set to a high temperature while inhibiting breaking of the filament. Therefore, the halogen lamps HL have characteristics that the life thereof is long compared with normal incandescent light bulbs and that strong light can be continuously radiated. In other words, the halogen lamps HL are continuous lighting lamps which emit light continuously at least one second or more. Moreover, the halogen lamps HL have long lives since they are rod-shaped lamps, and, as a result of disposing the halogen lamps HL along the horizontal direction, the radiation efficiency to the semiconductor wafer W in the upper side becomes excellent.

Also in the housing 41 of the halogen heating unit 4, a reflector 43 is provided in the lower side of the two levels of halogen lamps HL (FIG. 1). The reflector 43 reflects the light, which is emitted from the plurality of halogen lamps HL, to the side of the heat treatment space 65.

The control unit 3 controls the above described various operation mechanisms, which are provided in the heat treatment apparatus 1. The configuration of the control unit 3 as hardware is similar to a general computer. More specifically, the control unit 3 is provided with: a CPU serving as a circuit which carries out various arithmetic processing, a ROM serving as a read-only memory which stores basic programs, a RAM serving as a readable/writable memory which stores various information, and a magnetic disk which stores control software, data, etc. When the CPU of the control unit 3 executes a predetermined processing program, the process in the heat treatment apparatus 1 progresses.

Other than the above described configuration, the heat treatment apparatus 1 is provided with various cooling structures in order to prevent excessive temperature rises of the halogen heating unit 4, the flash heating unit 5, and the chamber 6 caused by the heat energy generated by the halogen lamps HL and the flash lamps FL in the heat treatment of the semiconductor wafer W. For example, the wall of the chamber 6 is provided with a water cooling pipe (not shown). The halogen heating unit 4 and the flash heating unit 5 have air-cooling structures which form gaseous flows therein and exhaust heat. Air is supplied also to the gap between the upper chamber window 63 and the lamp-light radiation window 53 and cools the flash heating unit 5 and the upper chamber window 63.

Figure 9:
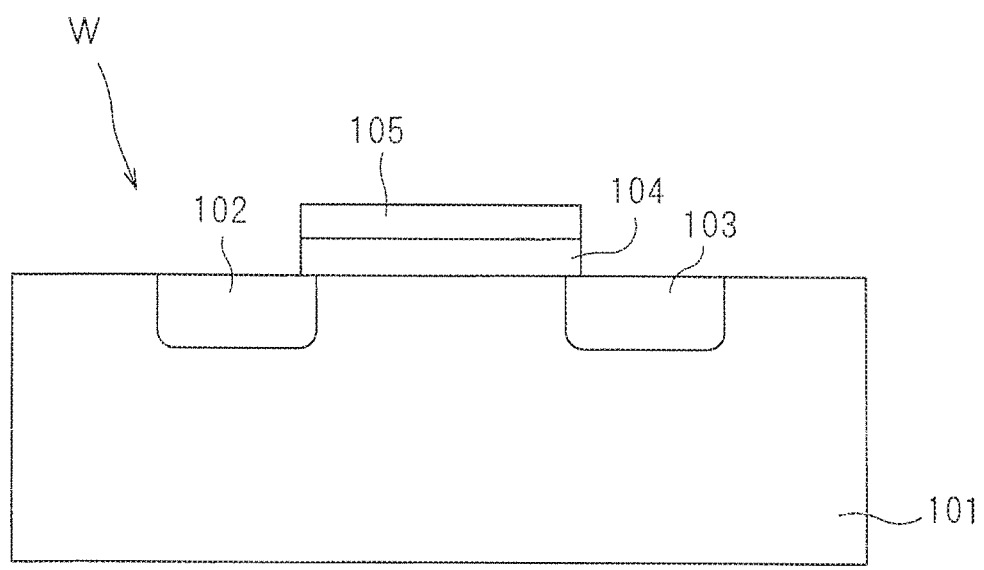
FIG. 9 is a diagram schematically showing a structure of a semiconductor wafer on which a high-dielectric-constant gate insulating film is formed.

Next, the manufacturing method of the semiconductor device according to the present invention will be described. In the present preferred embodiment, first, a silicon oxide film is formed on the surface of the semiconductor wafer W of silicon (Si), and a high-dielectric-constant gate insulating film (High-k film) is formed thereon. FIG. 9 is a diagram schematically showing a structure of the semiconductor wafer W on which the high-dielectric-constant gate insulating film is formed.

In the present preferred embodiment, before a gate is formed, ions (for example, arsenic (As), phosphorous (P), boron (B)) are implanted into a silicon base material 101, and a source 102 and a drain 103 are formed. An interface layer film 104 of silicon dioxide ($SiO_2$) is formed on the surface of the silicon base material 101 on which the source 102 and the drain 103 are formed. The interface layer film 104 is an underlying layer required for maintaining good interface characteristics between the high-dielectric-constant gate insulating film 105 and the silicon base material 101. The film thickness of the interface layer film 104 of silicon dioxide is extremely thin and is, for example, about 1 nm. As a formation method of the interface layer film 104, for example, publicly-known various methods such as a thermal oxidation method can be employed.

Then, the high-dielectric-constant gate insulating film 105 is formed on the interface layer film 104 of silicon dioxide. As the high-dielectric-constant gate insulating film 105, for example, a high-dielectric-constant material such as $HfO_2$, $ZrO_2$, $Al_2O_3$, $La_2O_3$, or the like can be used (in the present preferred embodiment, $HfO_2$). The high-dielectric-constant gate insulating film 105 can be formed by depositing the high-dielectric-constant material on the interface layer film 104, for example, by ALD (Atomic Layer Deposition). The film thickness of the high-dielectric-constant gate insulating film 105 deposited on the interface layer film 104 is also extremely thin and is, for example, about 1 nm. The formation method of the high-dielectric-constant gate insulating film 105 is not limited to ALD, and, for example, a publicly known method such as MOCVD (Metal Organic Chemical Vapor Deposition) can be employed.

Figure 10:
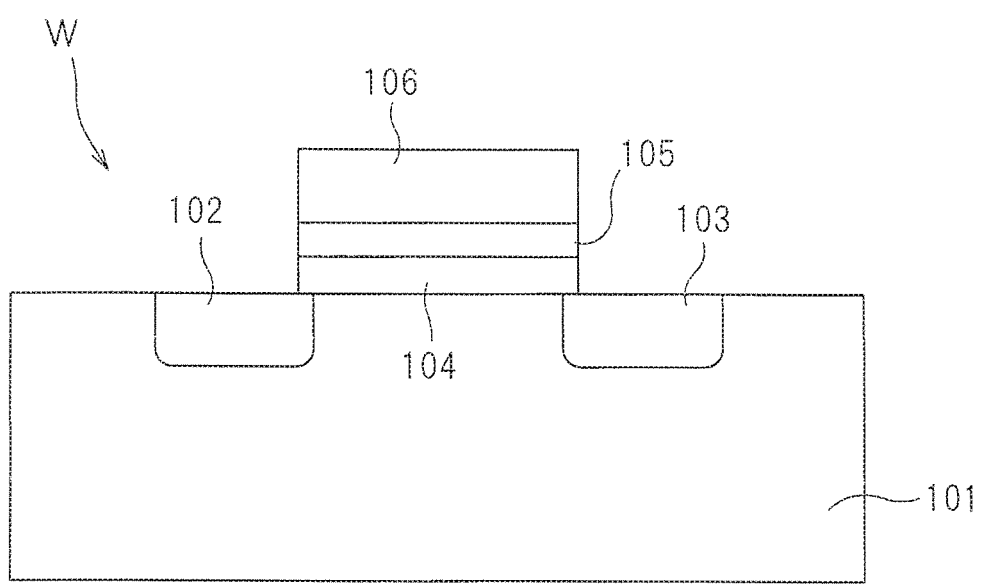
FIG. 10 is a diagram schematically showing the structure of the semiconductor wafer on which a metal gate electrode is formed.

Then, a metal gate electrode is further formed on the high-dielectric-constant gate insulating film 105. FIG. 10 is a diagram schematically showing the structure of the semiconductor wafer W on which the metal gate electrode is formed. Herein, in the present preferred embodiment, the metal gate electrode 106 containing fluorine (F) is formed on the high-dielectric-constant gate insulating film 105. The metal gate electrode 106 is formed of, for example, titanium nitride (TiN). The titanium nitride is a nitride of titanium, and titanium is typically obtained by reducing titanium tetrachloride ($TiCl_4$). The titanium nitride containing fluorine can be obtained by using a material obtained by replacing part of chlorine of the titanium tetrachloride with fluorine as a raw material. With such titanium nitride containing fluorine, the metal gate electrode 106 is formed on the high-dielectric-constant gate insulating film 105.

As a formation method of the metal gate electrode 106, for example, CVD or ALD can be used. The film thickness of the metal gate electrode 106 formed on the high-dielectric-constant gate insulating film 105 is 10 nm to 20 nm. The content (concentration) of fluorine in the metal gate electrode 106 is 0.1 at % or more to 10 at % or less.

Then, heat treatment with respect to the semiconductor wafer W on which the metal gate electrode 106 containing fluorine is formed is carried out by the above described heat treatment apparatus 1. Hereinafter, the heat treatment of the semiconductor wafer W by the heat treatment apparatus 1 will be described. A treatment procedure of the heat treatment apparatus 1 described below progresses when the control unit 3 controls the operation mechanisms of the heat treatment apparatus 1.

First, the gate valve 185 is opened to open the conveyance opening 66, and the semiconductor wafer W is carried into the heat treatment space 65 in the chamber 6 via the conveyance opening 66 by a conveyance robot outside the apparatus. The semiconductor wafer W carried in by the conveyance robot moves forward to the position immediately above the retention unit 7 and stops. Then, the pair of transfer arms 11 of the transfer mechanism 10 are horizontally moved from the escape positions to the transfer operation position and are moved up, and, as a result, the lift pins 12 project from the upper surface of the retention plate 75 of the susceptor 74 through the through holes 79 and receive the semiconductor wafer W. In this process, the lift pins 12 are moved up to the upper side of the upper ends of the substrate support pins 77.

After the semiconductor wafer W is placed on the lift pins 12, the conveyance robot exits from the heat treatment space 65, and the conveyance opening 66 is closed by the gate valve 185. Then, the pair of transfer arms 11 are moved down, and, as a result, the semiconductor wafer W is passed from the transfer mechanism 10 to the susceptor 74 of the retention unit 7 and is retained from the lower side in a horizontal orientation. The semiconductor wafer W is retained by the susceptor 74 by being supported by the plurality of substrate support pins 77, which are provided on the retention plate 75 to rise therefrom. The semiconductor wafer W is retained by the retention unit 7 while the front surface on which the high-dielectric-constant gate insulating film 105 and the metal gate electrode 106 are formed serves as an upper surface. Between a back surface of the semiconductor wafer W supported by the plurality of substrate support pins 77 (the main surface in the opposite side of the front surface) and the retention surface 75a of the retention plate 75, a predetermined interval is formed. The pair of transfer arms 11 moved down to the lower side of the susceptor 74 are caused to escape to the escape positions, in other words, to the inside of the recessed part 62 by the horizontal movement mechanism 13.

After the conveyance opening 66 is closed by the gate valve 185 to cause the heat treatment space 65 to be hermetically sealed space, the atmosphere in the chamber 6 is adjusted. Specifically, the valve 84 is opened, and a treatment gas is supplied from the gas supply hole 81 to the heat treatment space 65. In the present preferred embodiment, a mixed gas of hydrogen and nitrogen is supplied as the treatment gas to the heat treatment space 65 in the chamber 6. The valve 89 is opened to discharge the gaseous matter in the chamber 6 from the gas exhaust hole 86. As a result, the treatment gas supplied from the upper part of the heat treatment space 65 in the chamber 6 flows to the lower side and is discharged from the lower part of the heat treatment space 65, and the heat treatment space 65 is replaced by the atmosphere containing hydrogen. When the valve 192 is opened, the gaseous matter in the chamber 6 is discharged also from the conveyance opening 66. Furthermore, the atmosphere around the drive unit of the transfer mechanism 10 is also discharged by an exhaust mechanism (not shown).

The interior of the chamber 6 is replaced by the atmosphere containing hydrogen, and the semiconductor wafer W is retained in the horizontal orientation from the lower side by the susceptor 74; and, then, the 40 halogen lamps HL of the halogen heating unit 4 are lit at the same time, and preliminary heating (assist heating) is started. The halogen light emitted from the halogen lamps HL transmits through the lower chamber window 64 and the susceptor 74, which are formed of quartz, and is radiated from the back surface of the semiconductor wafer W. By receiving the light radiation from the halogen lamps HL, the semiconductor wafer W is subjected to preliminary heating, and the temperature thereof is increased. The transfer arms 11 of the transfer mechanism 10 have escaped to the inside of the recessed part 62 and, therefore, do not disturb the heating by the halogen lamps HL.

When the preliminary heating by the halogen lamps HL is carried out, the temperature of the semiconductor wafer W is measured by the radiation thermometer 120. More specifically, the infrared light radiated from the back surface of the semiconductor wafer W, which is retained by the susceptor 74, via the opening 78 is received by the radiation thermometer 120 to measure the wafer temperature during the temperature increase. The measured temperature of the semiconductor wafer W is transmitted to the control unit 3. The control unit 3 monitors whether the temperature of the semiconductor wafer W, which is increased by the light radiation from the halogen lamps HL, has reached a predetermined preliminary heating temperature T1 or not and, at the same time, controls the output of the halogen lamps HL. More specifically, the control unit 3 subjects the output of the halogen lamps HL to feedback control based on the value measured by the radiation thermometer 120 so that the temperature of the semiconductor wafer W becomes the preliminary heating temperature T1. The preliminary heating temperature T1 is about 350° C. to 600° C. (600° C. in the present preferred embodiment).

After the temperature of the semiconductor wafer W has reached the preliminary heating temperature T1, the control unit 3 maintains the semiconductor wafer W at the preliminary heating temperature T1 for a while. Specifically, at the point of time when the temperature of the semiconductor wafer W measured by the radiation thermometer 120 reaches the preliminary heating temperature T1, the control unit 3 adjusts the output of the halogen lamps HL and maintains the temperature of the semiconductor wafer W approximately to the preliminary heating temperature T1.

By carrying out such preliminary heating by the halogen lamps HL, the temperature of the entire semiconductor wafer W is uniformly increased to the preliminary heating temperature T1. In the stage of the preliminary heating by the halogen lamps HL, there is a tendency that the temperature of the peripheral part of the semiconductor wafer W at which heat dissipation more readily occurs is reduced than that of the central part. However, the disposition density of the halogen lamps HL in the halogen heating unit 4 is higher in the region opposed to the peripheral part than the region opposed to the central part of the semiconductor wafer W. Therefore, the light intensity radiated to the peripheral part of the semiconductor wafer W at which heat dissipation readily occurs becomes high, and the in-plane temperature distribution of the semiconductor wafer W in the preliminary heating stage can be uniformized. Furthermore, since the inner peripheral surface of the reflection ring 69 attached to the chamber lateral part 61 is formed into the mirror surface, the light intensity reflected by the inner peripheral surface of the reflection ring 69 toward the peripheral part of the semiconductor wafer W becomes high, and the in-plane temperature distribution of the semiconductor wafer W in the preliminary heating stage can be more uniformized.

At the point of time when predetermined time has elapsed after the temperature of the semiconductor wafer W reaches the preliminary heating temperature T1, flash light radiation to the front surface of the semiconductor wafer W is carried out from the flash lamps FL of the flash heating unit 5. When the flash light radiation is to be carried out by the flash lamps FL, electric charge is accumulated in the capacitor 93 by the electric-power-source unit 95 in advance. Then, in the state in which the electric charge is accumulated in the capacitor 93, the pulse signal is output from the pulse generator 31 of the control unit 3 to the IGBT 96 and subjects the IGBT 96 to on/off drive.

The waveform of the pulse signal can be defined by inputting, from the input unit 33, a recipe in which the time of a pulse width(s) (on time) and the time of a pulse interval(s) (off time) are sequentially set as parameters. When such a recipe is input by an operator from the input unit 33 to the control unit 3, in accordance with that, the waveform setting unit 32 of the control unit 3 sets a pulse waveform which repeats on/off. Then, in accordance with the pulse waveform set by the waveform setting unit 32, the pulse generator 31 outputs the pulse signal. As a result, the pulse signal of the set waveform is applied to the gate of the IGBT 96, and the on/off drive of the IGBT 96 is controlled. Specifically, when the pulse signal input to the gate of the IGBT 96 is on, the IGBT 96 becomes an on-state; and, when the pulse signal is off, the IGBT 96 becomes an off-state.

In synchronization with the timing at which the pulse signal output from the pulse generator 31 becomes on, the control unit 3 controls the trigger circuit 97 and applies a high voltage (trigger voltage) to the trigger electrode 91. In the state in which electric charge is accumulated in the capacitor 93, the pulse signal is input to the gate of the IGBT 96, and the high voltage is applied to the trigger electrode 91 in synchronization with the timing at which the pulse signal becomes on; as a result, when the pulse signal is on, a current always flows between the both end electrodes in the glass tube 92, and light is emitted by the excitation of the atoms or molecules of xenon by this process.

In this manner, the 30 flash lamps FL of the flash heating unit 5 emit light, and the flash light is radiated to the front surface of the semiconductor wafer W retained by the retention unit 7. Herein, if the flash lamp FL is caused to emit light without using the IGBT 96, the electric charge accumulated in the capacitor 93 is consumed in one light emission, and the output waveform from the flash lamp FL becomes a simple single pulse having a width of about 0.1 milliseconds to 10 milliseconds. On the other hand, in the present preferred embodiment, the IGBT 96 serving as the switching element is connected in the circuit, and the pulse signal is output to the gate thereof so as to connect/disconnect the supply of electric charge from the capacitor 93 to the flash lamp FL by the IGBT 96 and on/off control of the current which flows to the flash lamp FL is carried out. As a result, the light emission of the flash lamp FL is subjected to so-called chopper control, the electric charge accumulated in the capacitor 93 is divided and consumed, and the flash lamp FL repeats blinking in an extremely short period of time. Since a next pulse is applied to the gate of the IGBT 96 and increases the current value again before the current value flowing in the circuit becomes completely "0", light-emission output does not become completely "0" even while the flash lamp FL is repeating blinking.

By subjecting the current flowing to the flash lamp FL to the on/off control by the IGBT 96, the light-emission pattern (time waveform of light-emission output) of the flash lamp FL can be freely defined, and light-emission time and light-emission intensity can be freely adjusted. The pattern of the on/off drive of the IGBT 96 is defined by the time of the pulse width and the time of the pulse interval input from the input unit 33. In other words, as a result of incorporating the IGBT 96 in the drive circuit of the flash lamp FL, the light-emission pattern of the flash lamp FL can be freely defined only by appropriately setting the time of the pulse width and the time of the pulse interval input from the input unit 33.

Specifically, for example, if the ratio of the time of the pulse width with respect to the time of the pulse interval input from the input unit 33 is increased, the current flowing to the flash lamp FL is increased, and the light-emission intensity becomes strong. Conversely, if the ratio of the time of the pulse width with respect to the time of the pulse interval input from the input unit 33 is reduced, the current flowing to the flash lamp FL is reduced, and the light-emission intensity becomes weak. If the ratio of the time of the pulse interval and the time of the pulse width input from the input unit 33 is appropriately adjusted, the light-emission intensity of the flash lamp FL is constantly maintained. Furthermore, when the total time of the combination of the time of the pulse width and the time of the pulse interval input from the input unit 33 is increased, a current continues to flow to the flash lamp FL for a comparatively long period of time, and the light-emission time of the flash lamp FL is increased. In the present preferred embodiment, the light-emission time of the flash lamp FL is set between 0.1 milliseconds to 100 milliseconds.

In this manner, flash light is radiated to the front surface of the semiconductor wafer W from the flash lamps FL for the radiation time of 0.1 milliseconds or more to 100 milliseconds or less, and flash heating of the semiconductor wafer W is carried out. When the extremely-short and strong flash light having the radiation time of 0.1 milliseconds or more to 100 milliseconds or less is radiated, the temperature of the front surface of the semiconductor wafer W including the high-dielectric-constant gate insulating film 105 and the metal gate electrode 106 is momentarily increased to a treatment temperature T2. The treatment temperature T2 which is a highest temperature (peak temperature) reached by the front surface of the semiconductor wafer W by the flash light radiation is 900° C. or more and, in the present preferred embodiment, is 1000° C. In the flash heating, the radiation time of the flash light is an extremely short period of time of 100 milliseconds or less; therefore, after the surface temperature of the semiconductor wafer W is instantaneously increased to the treatment temperature T2, the surface temperature is immediately reduced to the vicinity of the preliminary heating temperature T1.

FIG. 11 is a diagram for describing a phenomenon which occurs when the surface of the semiconductor wafer W is subjected to flash heating. If the front surface of the semiconductor wafer W including the high-dielectric-constant gate insulating film 105 and the metal gate electrode 106 is heated to the treatment temperature T2 of 900° C. or more, the fluorine contained in the titanium nitride of the metal gate electrode 106 goes over the interface with the high-dielectric-constant gate insulating film 105 and diffuses into the high-dielectric-constant gate insulating film 105. The fluorine diffused into the high-dielectric-constant gate insulating film 105 further diffuses into the interface layer film 104 of silicon dioxide and reaches the interface between the interface layer film 104 and the silicon base material 101.

The fluorine which has reached the interface between the interface layer film 104 and the silicon base material 101 terminates the dangling bonds which have been present at the interface. As a result, the interface state between the interface layer film 104 and the silicon base material 101 is reduced. The fluorine which has diffused in the high-dielectric-constant gate insulating film 105 bonds with the traps which are present in the high-dielectric-constant gate insulating film 105 and eliminates them. As a result, the reliability of a gate stack structure including the interface layer film 104 and the high-dielectric-constant gate insulating film 105 is improved.

As a result of subjecting the front surface of the semiconductor wafer W to flash heating, post deposition annealing (PDA) of the high-dielectric-constant gate insulating film 105 is executed. More specifically, although the high-dielectric-constant gate insulating film 105 which has not been subjected to particular heat treatment immediately after deposition contains many defects such as point defects, such defects are reduced when the temperature of the high-dielectric-constant gate insulating film 105 is increased to the treatment temperature T2 by the flash heating.

Incidentally, the titanium nitride of the metal gate electrode 106 contains not only fluorine, but also nitrogen. When the front surface of the semiconductor wafer W is heated to the treatment temperature T2 by the flash heating, the nitrogen contained in the metal gate electrode 106 also diffuses into the high-dielectric-constant gate insulating film 105. If the nitrogen further diffuses into the interface layer film 104 of silicon dioxide and reaches the interface between the interface layer film 104 and the silicon base material 101, interface characteristics are adversely deteriorated. However, the diffusion of the nitrogen remains at the interface between the high-dielectric-constant gate insulating film 105 and the interface layer film 104. It is for a reason that the diffusion coefficient of nitrogen is small compared with the diffusion coefficient of fluorine in silicon dioxide, and, in the extremely short period of time of 100 milliseconds or less, nitrogen cannot diffuse in the interface layer film 104 and reach the interface with the silicon base material 101. Thus, by carrying out the heating treatment by the flash light radiation for the extremely short period of time of 100 milliseconds or less, the diffusion of nitrogen which deteriorates the interface characteristics is inhibited, at the same time, only the fluorine is caused to diffuse to the interface between the interface layer film 104 and the silicon base material 101, reduce the interface state, and improve the reliability of the gate stack structure.

After a predetermined period of time elapses after the flash heating treatment is finished, the halogen lamps HL are turned off. As a result, the temperature of the semiconductor wafer W is rapidly reduced from the preliminary heating temperature T1. Moreover, the supply of hydrogen into the chamber 6 is stopped, only nitrogen is supplied, and the heat treatment space 65 in the chamber 6 is replaced by a nitrogen atmosphere. The temperature of the semiconductor wafer W during the temperature reduction is measured by the radiation thermometer 120, and the measurement result thereof is transmitted to the control unit 3. According to the measurement result of the radiation thermometer 120, the control unit 3 monitors whether the temperature of the semiconductor wafer W has been reduced to a predetermined temperature or not. Then, after the temperature of the semiconductor wafer W is reduced to the predetermined temperature or less, the pair of transfer arms 11 of the transfer mechanism 10 are horizontally moved again from the escape positions to the transfer operation positions and moved up; as a result, the lift pins 12 project from the upper surface of the susceptor 74 to receive the heat-treated semiconductor wafer W from the susceptor 74. Subsequently, the conveyance opening 66 closed by the gate valve 185 is opened, the semiconductor wafer W placed on the lift pins 12 is carried out by the conveyance robot outside the apparatus, and the heating treatment of the semiconductor wafer W in the heat treatment apparatus 1 is completed.

In the present preferred embodiment, the metal gate electrode 106 containing fluorine is formed on the high-dielectric-constant gate insulating film 105 formed on the silicon base material 101 with the interface layer film 104 of silicon dioxide sandwiched therebetween, and the heating treatment by the flash light radiation is carried out for the extremely short period of time of 100 milliseconds or less; as a result, diffusion of nitrogen is inhibited, and, at the same time, only the fluorine can be diffused to the interface between the interface layer film 104 and the silicon base material 101. Since only the fluorine is diffused to the interface between the interface layer film 104 and the silicon base material 101 while inhibiting the diffusion of nitrogen which deteriorates the interface characteristics, the interface state is reduced, and the reliability of the gate stack structure can be improved. The flash-light radiation time of the flash lamps FL can be appropriately adjusted within the range of 0.1 milliseconds or more to 100 milliseconds or less.

Moreover, since the fluorine is diffused from the metal gate electrode 106 containing the fluorine to the high-dielectric-constant gate insulating film 105 and the interface layer film 104 by the heating treatment of the extremely short period of time, without damaging a device structure formed on the semiconductor wafer W, the fluorine can be introduced to the device structure.

Moreover, since the flash heating treatment of the semiconductor wafer W is carried out in the atmosphere containing hydrogen, the diffusion rate of fluorine in the interface layer film 104 of silicon dioxide becomes fast, and fluorine can be more reliably introduced to the interface between the interface layer film 104 and the silicon base material 101.

Hereinabove, the preferred embodiment of the present invention has been described. However, various changes can be made other than those described above as long as the present invention does not depart from the gist thereof. For example, although the metal gate electrode 106 is formed of titanium nitride in the above described preferred embodiment, but is not limited thereto, and it may be formed of tantalum nitride (TaN), aluminum nitride (AlN), or the like. Even if the metal gate electrode 106 is formed of tantalum nitride or aluminum nitride, by forming the metal gate electrode 106 containing fluorine on the high-dielectric-constant gate insulating film 105 and carrying out flash heating treatment, as well as the above described preferred embodiment, only fluorine can be diffused to the interface between the interface layer film 104 and the silicon base material 101 while inhibiting diffusion of nitrogen.

Meanwhile, instead of the metal gate electrode 106, a thin film containing fluorine may be formed on the high-dielectric-constant gate insulating film 105, and flash heating treatment may be carried out. Also in this case, fluorine is diffused to the high-dielectric-constant gate insulating film 105 and the interface layer film 104 to reduce the interface state between the interface layer film 104 and the silicon base material 101, and the reliability of the gate stack structure can be improved.

Meanwhile, in the above described preferred embodiment, the flash heating treatment is carried out to carry out the post deposition annealing of the high-dielectric-constant gate insulating film 105 in combination after the metal gate electrode 106 containing fluorine is formed. However, instead of this, the post deposition annealing of the high-dielectric-constant gate insulating film 105 may be carried out before the metal gate electrode 106 is formed.

Meanwhile, in the above described preferred embodiment, the flash heating treatment of the semiconductor wafer W is carried out in the atmosphere containing hydrogen. However, it is not limited thereto, and the flash heating treatment may be carried out in an atmosphere containing ammonia ($NH_3$), nitrogen trifluoride ($NF_3$), fluorine ($F_2$), or the like. In other words, the flash heating treatment of the semiconductor wafer W may be carried out in the gas atmosphere of one selected from a group consisting of hydrogen, ammonia, nitrogen trifluoride, and fluorine.

If the flash heating treatment is carried out in the atmosphere containing hydrogen as described above, the diffusion rate of fluorine in the interface layer film 104 of silicon dioxide can be increased. Meanwhile, if the flash heating treatment is carried out in the atmosphere containing ammonia or nitrogen trifluoride, nitrogen in the high-dielectric-constant gate insulating film 105 can be compensated for. Furthermore, if the flash heating treatment is carried out in the atmosphere containing fluorine, fluorine can be compensated for in a case in which the supply of fluorine only from the metal gate electrode 106 is not sufficient.

Meanwhile, the heat treatment of the semiconductor wafer W is carried out by the flash light radiation from the flash lamps FL in the above described preferred embodiment. However, it is not limited thereto, and the heat treatment is only required to be heating treatment of 100 milliseconds or less and may be carried out by, for example, laser annealing.

Meanwhile, the device structure serving as an application target of the techniques according to the present invention is not limited to planar FET, but may be a FET of a Fin structure.

Meanwhile, the flash heating unit 5 is provided with the 30 flash lamps FL in the above described preferred embodiment. However, it is not limited thereto, and the number of the flash lamps FL may be an arbitrary number. Meanwhile, the flash lamps FL are not limited to xenon flash lamps, but may be krypton flash lamps. Meanwhile, the number of the halogen lamps HL provided in the halogen heating unit 4 is not limited to 40, but may be an arbitrary number.

Meanwhile, the semiconductor wafer W is subjected to the preliminary heating by the halogen light radiation from the halogen lamps HL in the above described preferred embodiment. However, the method of the preliminary heating is not limited thereto, and the semiconductor wafer W may be subjected to preliminary heating by placing it on a hot plate.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a semiconductor device of forming a high-dielectric-constant gate insulating film on a silicon substrate with an interface layer film sandwiched therebetween, the manufacturing method comprising:
   (a) forming the high-dielectric-constant gate insulating film on a surface of said substrate with the interface layer film of silicon dioxide sandwiched therebetween;
   (b) forming a metal gate electrode containing fluorine on said high-dielectric-constant gate insulating film; and
   (c) subjecting said substrate to heating treatment of 100 milliseconds or less in an atmosphere including hydrogen to increase a diffusion rate of the fluorine in the interface layer film and to diffuse the fluorine to said high-dielectric-constant gate insulating film and said interface layer film.

2. The manufacturing method of the semiconductor device according to claim 1, wherein said metal gate electrode contains TiN, TaN, or AlN.

3. The manufacturing method of the semiconductor device according to claim 1, wherein a content of the fluorine contained in said metal gate electrode is 0.1 at % or more to 10 at % or less.

4. The manufacturing method of the semiconductor device according to claim 1, wherein, the subjecting said substrate to heating treatment includes radiating flash light from a flash lamp to the surface of said substrate.

* * * * *